United States Patent
Leibl

(10) Patent No.: US 7,521,920 B2
(45) Date of Patent: Apr. 21, 2009

(54) MEASURING DEVICE FOR MEASURING THE OUTPUT CURRENT OF A CLOCKED HALF-BRIDGE CIRCUIT

(75) Inventor: Thomas Leibl, Seelbach (DE)

(73) Assignee: Schneider Electric Motion Deutschland GmbH & Co. KG, Lahr (DE)

( * ) Notice: Subject to any disclaimer, the term of this patent is extended or adjusted under 35 U.S.C. 154(b) by 0 days.

(21) Appl. No.: 11/843,472

(22) Filed: Aug. 22, 2007

(65) Prior Publication Data

US 2008/0048637 A1 Feb. 28, 2008

(30) Foreign Application Priority Data

Aug. 23, 2006 (DE) .................... 10 2006 039 413

(51) Int. Cl.
*G01R 19/00* (2006.01)
(52) U.S. Cl. .................................. 324/158.1; 324/120
(58) Field of Classification Search .................. None
See application file for complete search history.

(56) References Cited

U.S. PATENT DOCUMENTS 4,542,440 A * 9/1985 Chetty et al. ................ 361/111

6,573,788 B2 6/2003 Oppelt

FOREIGN PATENT DOCUMENTS

| DE | 4117505 | 12/1992 |
|----|---------|---------|
| DE | 19746349 | 5/1999 |
| DE | 10129850 | 7/2000 |

OTHER PUBLICATIONS

"Method and Device for Measuring the Output Current of a Clocked Half-Bridge Circuit" by Thomas Leibl, Dec. 17, 1995 (total 12 pages).*
LEM website, "Closed Loop Hall Effect", http://www.lem.de/hq/en/content/view/168/155/ (2 pages, Mar. 5, 2008).

* cited by examiner

*Primary Examiner*—Paresh Patel
(74) *Attorney, Agent, or Firm*—The Webb Law Firm

(57) ABSTRACT

The invention relates to a method for measuring the output current of a clocked half-bridge circuit (1) in which semiconductor switches (5a, 5b) located in half-bridge sections (2a, 2b) are alternatingly opened or closed in push-pull operation and thereby cause an alternating current in an output current circuit. The current flowing through a first semiconductor switch (5a) is measured. The current flowing through a first semiconductor switch (5a) is transformed inductively into a secondary current. At least two measured-value signals are generated for the secondary current, of which a first measured-value signal corresponds to the secondary current when the first semiconductor switch (5a) is closed, and a second measured-value signal corresponds to the secondary current when the first semiconductor switch (5b) is open. The output current is determined by taking the difference between the first and second measured-value signals FIG. 7.

14 Claims, 7 Drawing Sheets

MEASURING DEVICE FOR MEASURING THE OUTPUT CURRENT OF A CLOCKED HALF-BRIDGE CIRCUIT

BACKGROUND OF THE INVENTION

1. Field of the Invention

The invention relates to a method for measuring the output current of a clocked half-bridge circuit in which semiconductor switches located in half-bridge sections are alternately opened or closed in push-pull operation thereby causing a controllable current flow to occur in output current circuit, whereby the amperage of the current flowing through a first semiconductor switch is measured. The invention also relates to a measuring device to measure the output current of a clocked half-bridge circuit that has at least one half-bridge having two half-bridge sections connected in series, whose connection node is connected to an output connection; and a first semiconductor switch is disposed in a first half-bridge section, and a second semiconductor switch is disposed in a second half-bridge section, and said semiconductor switches can be controlled in push-pull operation by means of a control device, and with an alternating-current controller whose output is connected to a measured-signal input of the measured-value signal conditioning device, which has a measurement output for an output current measurement signal.

2. Description of Related Art

A method of this type and a measuring device of this type are disclosed in DE 41 17 505 C2. To control the winding of an electric motor, the measuring device has a half-bridge circuit having two half-bridge sections connected in series that are connected to a connection node on an output circuit that contains the motor winding. A series circuit comprising a first semiconductor switch and a shunt is located in a first half-bridge section, and a second semiconductor switch is located in a second half-bridge section. The semiconductor switches are controlled in alternation in a push-pull configuration by means of a control device. Each time during a first operating state the first semiconductor switch is closed, and the second semiconductor switch is closed during a second operating state. In each of the first operating states, one measured value for the current flowing through the first semiconductor switch is acquired with the aid of the shunt. This measured value provides the measurement result for the output current. In the first operating states, a second measured value is also acquired for the alternating current in the output circuit by means of an alternating-current converter.

This measured value is added to the first measured value. Then the result of this addition is inverted and saved. In the second operating state a measured value for the alternating current flowing in the output circuit is acquired and added to the saved value. The resulting total forms the measurement result in the second operating state.

The measuring device has proven to be effective in actual practice, mainly because it makes it possible to measure current in an output circuit that has a high electrical potential compared with the measurement circuit. However, a disadvantage of the measuring device is that the use of the shunt means that there is no electrical isolation between the power circuit and the measurement circuit. Moreover, the power loss in the shunt is undesirable.

Thus, the object of the invention is to create a method of the type referred to above that permits the output current to be measured in a simple, economical manner with low losses and, if possible, with electrical isolation. The object is also to disclose a measuring device of the type referred to above to perform the method.

SUMMARY OF THE INVENTION

This object is accomplished with respect to the method in that the current flowing through a first semiconductor switch is converted by transformational means into a secondary current, at least two measured-value signals are generated for the secondary current, of which a first measured-value signal corresponds to the secondary current when the first semiconductor switch is closed, and a second measured-value signal corresponds to the secondary current when the first semiconductor switch is open, and the output current is determined by taking the difference between the first and the second measured-value signals.

It is thereby possible and advantageous with the aid of an economical alternating-current converter (converter transformer) connected in series with the first semiconductor switch to measure the output current in a nearly loss-free manner with respect to the direct-current component and with respect to the alternating-current component. The lower cut-off frequency of the alternating-current converter is selected to be significantly less than the switching frequency of the semiconductor switches.

In a preferred embodiment of the invention, the first and second measurement signals are generated by sampling the secondary current. The sampled measurement signals can then be converted to digital signals and be processed in a simple manner in a microcomputer or in a signal-conditioning processor.

It is advantageous if the sampling for the first measured-value signal takes place centered in a time interval while the first semiconductor switch is closed, and/or the sampling for the second measured-value signal occurs centered in a time interval while the first semiconductor switch is open. High measurement accuracy is achieved in this way.

In a preferred embodiment of the invention, in the output circuit an alternating-current measurement is performed. In his measurement in a first operating state, in which the first semiconductor switch is closed, measured values for the output current determined with the aid of the secondary current and for the alternating current in the output circuit are added together, and the result of the addition is inverted and saved, and in the first operating state the output current determined with the aid of the secondary current provides the measurement result, and in a second operating state, in which the second semiconductor switch is closed, the saved value is added to the alternating-current measured value measured in the second operating state in the output circuit, and this total forms the measurement result in the second operating state. The output current of the half-bridge circuit can then be measured continuously.

In another preferred embodiment of the invention, an alternating-current measurement is performed in the output circuit. In this measurement in a first operating state, in which the first semiconductor switch is closed, measured values for the output current determined with the aid of the secondary current and for the alternating current in the output circuit are added together and saved, and in the first operating state the output current determined with the aid of the secondary current provides the measurement result, and in a second operating state, in which the second semiconductor switch is closed, the saved value is subtracted from the alternating-current measured value measured in the second operating state in the output circuit, and this total forms the measurement result in the second operating state.

The object referred to above is achieved with respect to the measuring device in that the input of the alternating-current converter in the first half-bridge section is connected in series to the first semiconductor switch, the measured-value signal conditioning device has means to generate at least two measured value signals, of which a first measured-value signal corresponds to the output current of the alternating-current converter when the first semiconductor switch is closed, and a second measured-value signal corresponds to the output current of the alternating-current converter when the first semiconductor switch is open, and the connections carrying the measured-value signals are connected to the measurement output across a subtraction element.

The output current of the half-bridge circuit can thereby be measured in a virtually loss-free manner with the aid of an economical, compact alternating-current converter, both with respect to its direct-current component as well as with respect to its alternating-current component. The alternating-current converter has windings that preferably are electrically isolated from each other. However, it can also be an autotransformer in which the secondary winding comprises part of the primary winding. The lower cutoff frequency of the alternating-current converter preferably is significantly lower than the switching frequency of the semiconductor switches.

It is advantageous if, to generate the measured-value signals, the measuring device has at least one sample-and-hold element whose input connection is connected to the output of the alternating-current converter and if one output connection of the sample-and-hold element is preferably connected to the output current measuring output by means of an analog-digital converter. The measurement signal for the output current can then be processed digitally in the control device.

In a preferred embodiment of the invention the sample-and-hold element is connected by means of a control connection to the control device for the semiconductor switches in such a way that the sampling for the first measured-value signal occurs centered in a time interval while the first semiconductor switch is closed, and/or the sampling for the second measured-value signal occurs centered in a time interval while the first semiconductor switch is open.

The output current of the half-bridge circuit can then be measured with high precision.

In a more preferred embodiment of the invention, the alternating-current converter has a primary inductance and an ohmic secondary resistance, and an active compensation circuit, which at least partially compensates for the voltage drop at the primary inductance caused by a flow of current in the secondary resistance by applying a voltage to the output of the alternating-current converter, is disposed between the output of the alternating-current converter and the measurement output. The lower cutoff frequency of the alternating-current converter can be decreased advantageously in this way, so that the alternating-current converter has a smaller volume.

The compensation circuit is preferably embodied as an INIC. It can be implemented economically with the aid of an operational amplifier and ohmic resistances.

The output of the alternating-current converter preferably is connected to a first input of a subtraction element, and the output of the subtraction element is connected to the measurement output and to an input of an additional sample-and-hold element, whose output is connected to a second input of the subtraction element, and a sampling input of the additional sample-and-hold element is connected to the control device by means of a control connection in such a way that the measurement output is at a specified electrical potential when the first semiconductor switch is closed or open. The output signal of the measuring device can then be controlled, for example, to zero at times during which no primary current is flowing in the alternating-current converter. An analog-digital converter that samples the output signal can then have a correspondingly reduced control range.

It is advantageous if a second alternating-current converter is connected in the output current circuit, if the output of the first alternating-current converter and the output of the second alternating-current converter are connected to the inputs of a first addition element and the output of this addition element is connected to a buffer, if the buffer has a control connection to the control device for closing the connection between the output of the first addition element and the buffer when the first semiconductor switch is closed, if, following the buffer, a second addition element is connected to the buffer, and its one input is connected to the buffer and its other input is connected to the output of the second alternating-current converter, and if the output of the second addition element forms the output current measuring output.

The output current of the half-bridge circuit can then be measured continuously.

In a preferred embodiment of the invention the second alternating-current converter has a second primary inductance and a second ohmic secondary resistance; and a second active compensation circuit, which at least partially compensates for the voltage drop caused at the second primary inductance by a current flow in the second secondary resistance by applying a voltage at the output of the second alternating-current converter, is located between the output of the second alternating-current converter and the inputs of the first addition element. The measuring device then permits even greater measuring accuracy.

In a preferred embodiment of the invention, the output connection is connected to the winding of an electric motor, in particular of a stepper motor. In the electrical drive unit that is comprised of the measuring device and the electric motor, the winding is preferably driven by means of three half-bridges connected together to form a full-bridge.

BRIEF DESCRIPTION OF THE DRAWINGS

Examples of embodiments of the invention are described in greater detail below based on the drawing. The drawing shows.

DETAILED DESCRIPTION OF THE PREFERRED EMBODIMENTS

Figure 1:
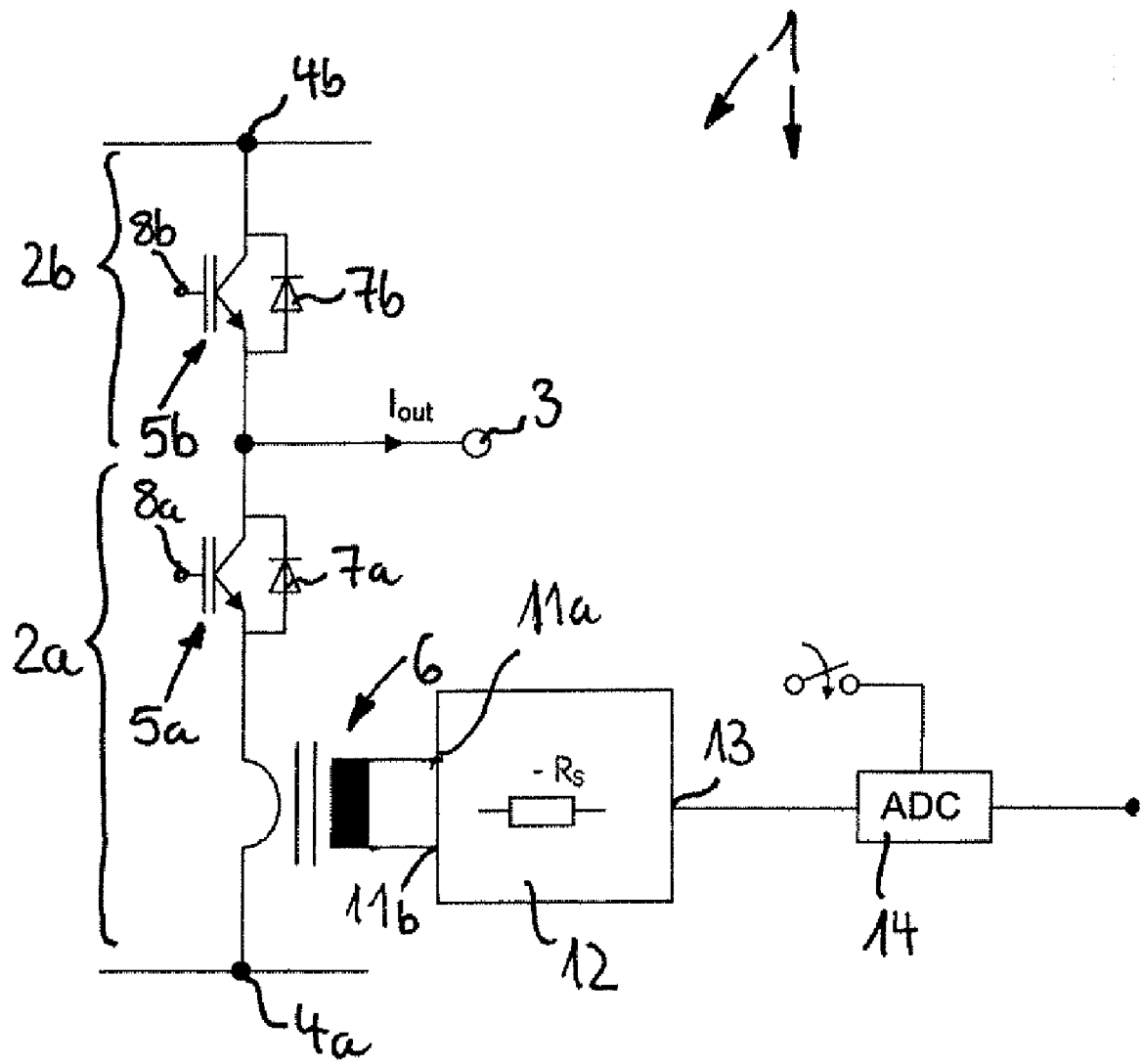
FIG. 1 a circuit diagram of a first example of an embodiment of a half-bridge circuit, FIG. 2 an illustration of the generation of a pulse width modulation signal, where in the upper diagram the count of a counter as well as a comparison value are shown and in the lower diagram the pulse width modulation signal is shown with time plotted on the abscissa and amplitude plotted on the ordinate, FIG. 3 a simplified equivalent circuit diagram of an alternating-current converter, FIG. 4 an illustration of the secondary current (solid line) of an alternating-current converter located in a half-bridge section and of the output current (dotted line) of the half-bridge, with time plotted on the abscissa and amperage plotted on the ordinate, FIG. 5 a diagram illustrating the calculation of the measured current value, FIG. 6 a flowchart illustrating the calculation of the measured current value, FIG. 7 a partial circuit diagram of a measuring device for measuring the output current of a clocked half-bridge circuit, and FIG. 8 an illustration of the step responses of an alternating-current converter compensated by means of an INIC and of an uncompensated alternating-current converter, with time plotted on the abscissa and current plotted on the ordinate, whereby the primary current is indicated by $i_p$.

A measuring device identified in its entirety in FIG. 1 with 1 for measuring the output current of a clocked half-bridge circuit that is used to control an electric motor has a half-bridge with two half-bridge sections 2a, 2b connected in series. The half-bridge sections 2a, 2b are connected at a connection node to an output connection 3 that is connected to a winding connection of the electric motor. A first half-bridge section 2a is connected on its end on the opposite side of output connection 3 to a first pole 4a of a power source, which is not specifically shown in the drawing, and a second half-bridge section 2b is connected on its end on the opposite side of output connection 3 to a second pole 4b of the power source.

As can be seen in FIG. 1, a series circuit consisting of a first semiconductor switch 5a and the primary winding of an alternating-current converter 6 is located in the first half-bridge section 2a, and a second semiconductor switch 5b is located in the second half-bridge section 2b. A freewheeling diode 7a, 7b that connects the emitter to the collector of the semiconductor switch 5a, 5b is respectively connected in parallel to the semiconductor switches 5a, 5b. The control inputs 8a, 8b of the semiconductor switches 5a, 5b are connected to a control device that sends pulse width modulation signals to the control inputs 8a, 8b in such a way that the semiconductor switches 5a, 5b are alternately opened and closed.

Figure 2:
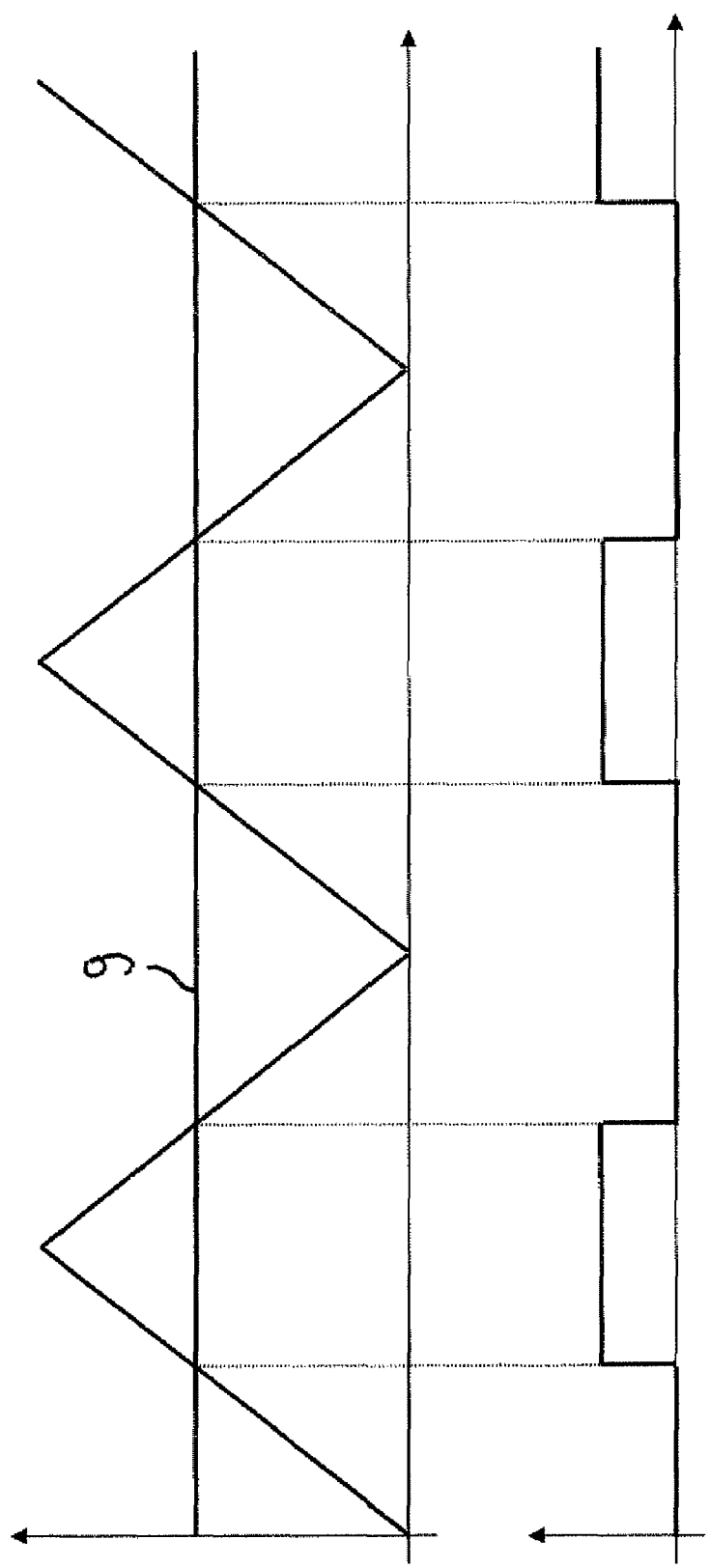

To generate the pulse width modulation signals, the control device has a counter that is periodically incremented until the specified maximum count is reached (FIG. 2). Then the counter is decremented until a minimum count is reached. Then the cycle is repeated periodically. The count is compared with a specified reference value numeral 9. If the count is greater than the reference value, a first potential is assigned to a control signal (FIG. 2 below); otherwise, a second potential is assigned. The first control input 8a is controlled with the control signal, and the second control input 8b is controlled with a signal that is inverse to the control signal.

Figure 3:
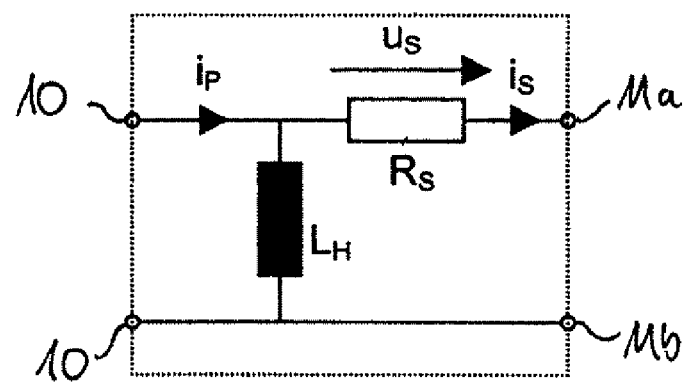

The alternating-current converter 6 generates by transformational means a significantly smaller secondary current from the current flowing through the first semiconductor switch 5a. This smaller secondary current is fed into a measured-value signal conditioning device. FIG. 3 shows that the equivalent circuit diagram of the alternating-current converter 6 has a primary inductance $L_H$ that is arranged parallel to the converter input connections 10. The alternating-current converter 6 also has an ohmic secondary resistance $R_S$ that is connected in series starting at a first output connection 11a to a second converter output connection 11b having a primary inductance $L_H$. A secondary current flowing between the converter output connections 11a, 11b causes a voltage drop at the secondary resistance $R_S$.

The measured-value signal conditioning device has an active compensation circuit 12 that applies a voltage directed in opposition to the voltage drop at the secondary resistance $R_S$ between the converter output connections 11. This voltage largely compensates for the voltage drop that occurs at the primary inductance $L_H$ due to the current flow in the secondary resistance $R_S$.

Figure 4:
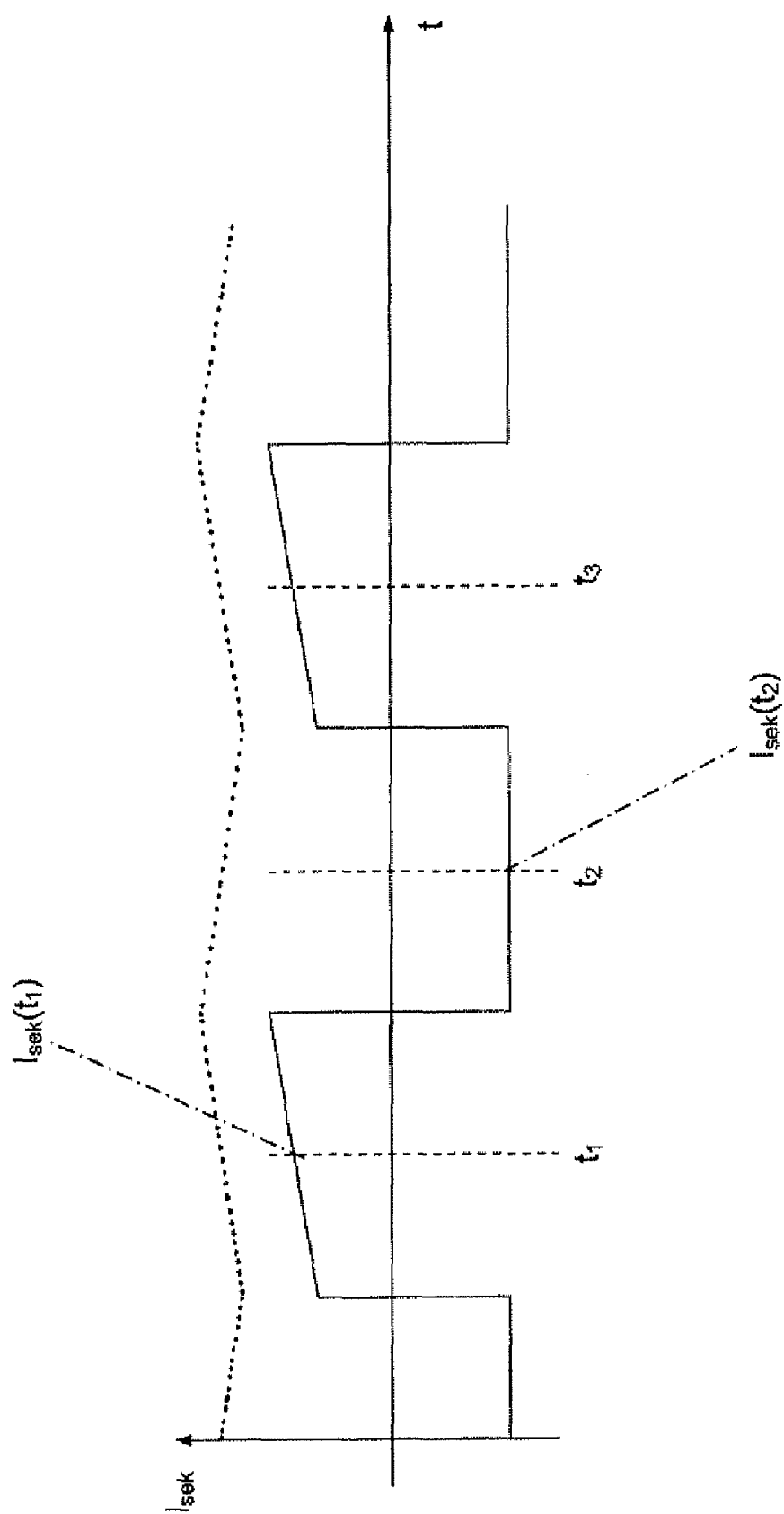

An analog-digital converter 14, which is only represented schematically in the drawing, is attached at an output 13 of the compensation circuit 12. It samples and digitizes the voltage that is present at compensation circuit output 13. As can be seen in FIG. 4, and the sampling of the secondary current occurs in each case at the center of the pulse phases (for example at times $t_1$, $t_3$) and at the center of the pulse pauses (for example at time $t_2$) of the control signal.

Figure 6:
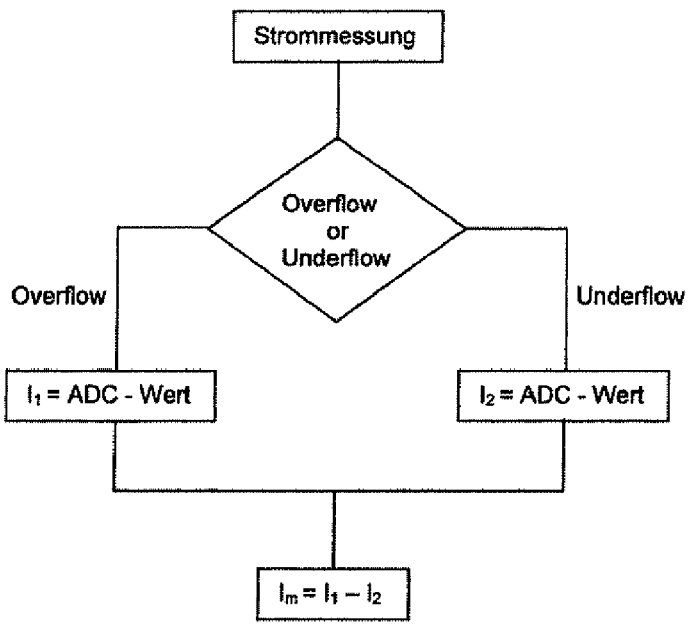
Figure 5:
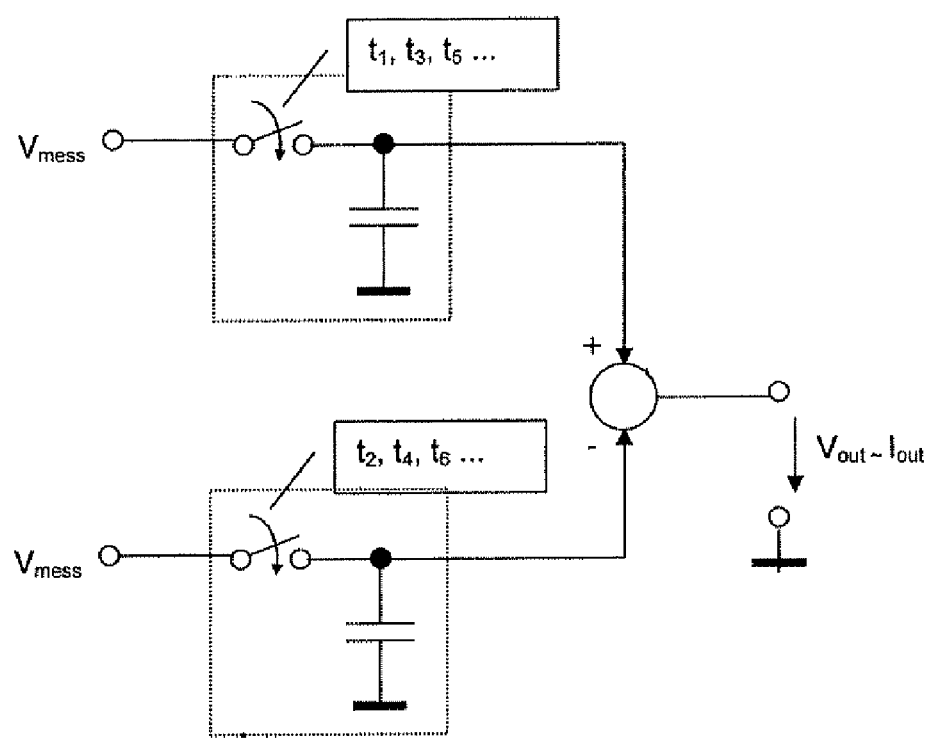

The measured-value signal conditioning device has means to generate two measured-value signals $I_{sek}(t_1), I_{sek}(t_2)$ shown in FIG. 4. Of these signals, a first measured-value signal $I_{sek}(t_1)$ corresponds to the output current of the alternating-current converter 6 when the first semiconductor switch 5a is closed, and a second measured-value signal corresponds to the output current of the alternating-current converter 6 when the first semiconductor switch 5a is open. As shown schematically in FIG. 5, the measured-value signals $I_{sek}(t_1), I_{sek}(t_2)$ are provided and temporarily stored in a microcomputer in the form of digital signals. The difference between the measured-value signals $I_{sek}(t_1), I_{sek}(t_2)$ is determined with the aid of a microprocessor (FIGS. 5 and 6). This corresponds to the output current flowing through the output connection. The corresponding difference signal is supplied to a measurement output.

Figure 7:
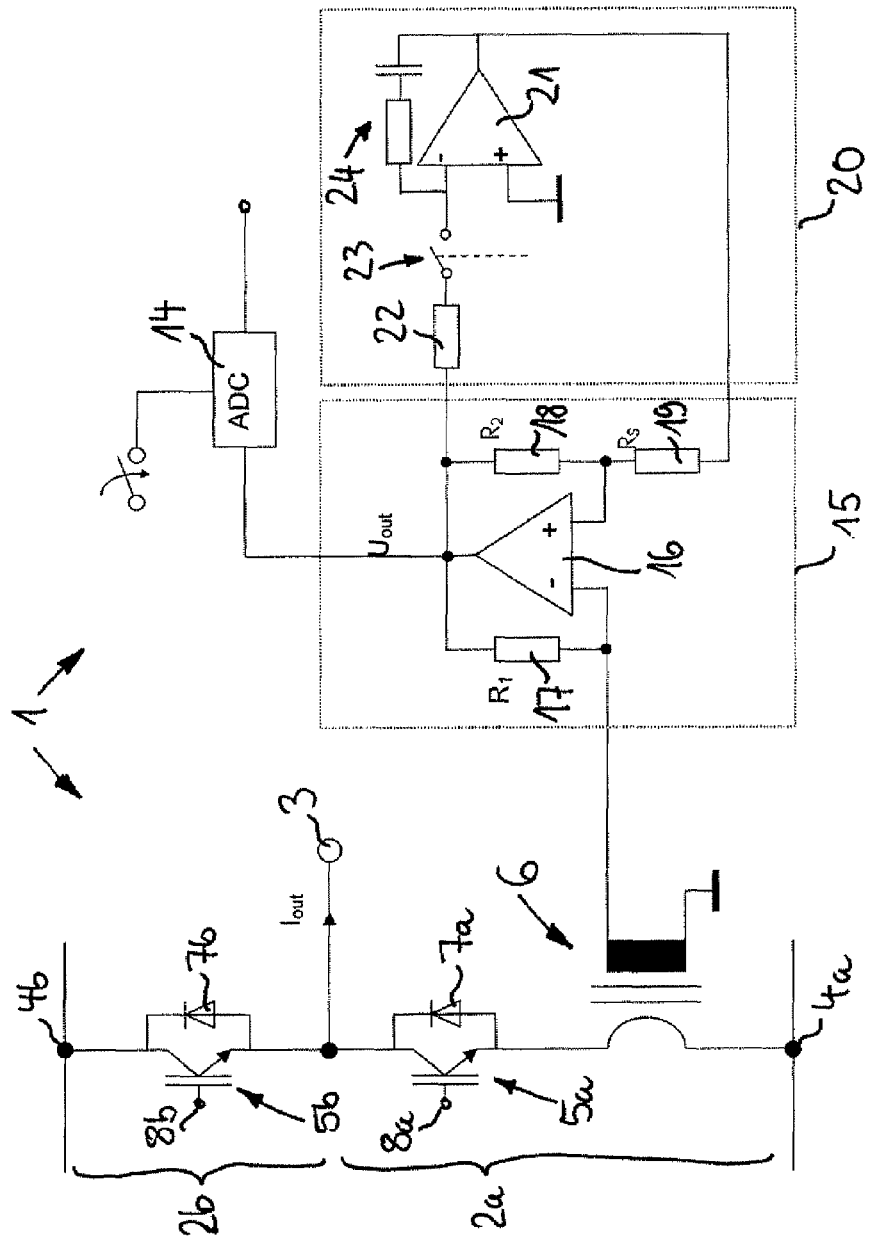

In the example of the embodiment shown in FIG. 7 the output of the alternating-current converter 6 is connected to the input of an INIC 15 that loads the output of the alternating-current converter 6 with a negative ohmic resistance which, ideally, is just as large in a negative direction as the ohmic secondary resistance $R_S$ of the alternating-current converter 6. However, to ensure that the circuit remains stable, the negative resistance cannot be made just as large. In actual practice, the negative resistance is chosen to be somewhat smaller than the secondary resistance $R_S$. The INIC 15 largely compensates for the unfavorable effect of the secondary resistance $R_S$. Since the negative ohmic input resistance of the INIC 15 is somewhat smaller than the ohmic secondary resistance $R_S$ of the alternating-current converter 6, the circuit operates in a stable manner.

Figure 8:
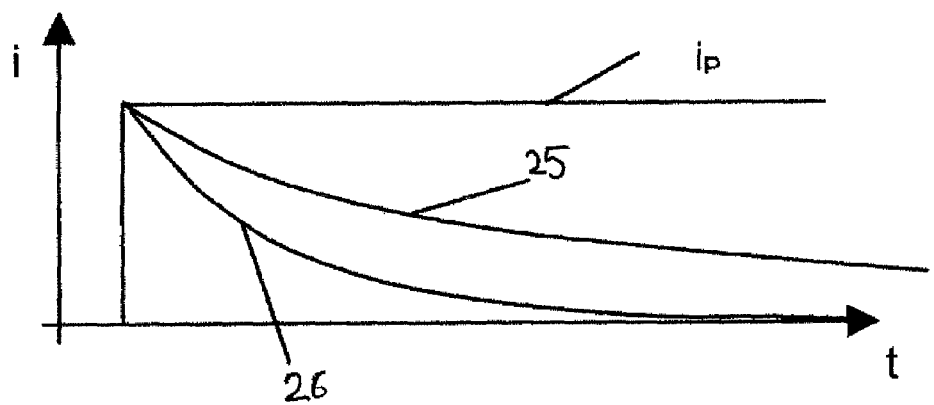

As can be seen in FIG. 7, the INIC 15 has an operational amplifier 16 whose inverting input is connected to an output connection of the alternating-current converter 6. The other output of the alternating-current converter 6 is connected to ground potential. The inverting input of the operational amplifier 16 is connected across a first resistance 17 to the output of the operational amplifier 16. This amplifier is connected to the input of the analog-digital converter 14. The noninverting input of the second operational amplifier 16 is connected across a second resistance 18 to the output of the second operational amplifier 16. In addition, the noninverting input of the second operational amplifier 16 is connected across a third resistance 19 to the output of an additional sample-and-hold element 20. The electrical voltage at the primary inductance $L_H$ of the alternating-current converter 6 is controlled to a value approaching zero by the INIC 15. Thus, the alternating-current converter 6 transfers the current proportionally, even at low frequencies. FIG. 8 shows that the step response 25 of an alternating-current converter 6 compensated with the INIC 15 has a flatter curve than the step response 26 of a corresponding uncompensated alternating-current converter 6.

The additional sample-and-hold element 20 has a second operational amplifier 21 that is connected across a fourth resistance 22 and an electronic switch 23 to the inverting input of the second operational amplifier 21. The inverting input is also connected across an RC element 24 to the output of the second operational amplifier 21. The noninverting input of the second operational amplifier 21 is connected to ground potential. A sampling input (which is not shown in detail in the drawing) of the electronic switch 23 is connected to the control device by means of a control connection in such a way that the switch 23 is conductive when the first semiconductor switch 5a is open.

The invention claimed is:

1. A method for measuring the output current of a clocked half-bridge circuit in which semiconductor switches located in half-bridge sections are alternately opened or closed in push-pull operation, thereby causing a controllable current flow to occur in an output current circuit, whereby the amperage of the current flowing though a first semiconductor switch is measured, wherein the current flowing through a first semiconductor switch is converted by transformational means into a secondary current, at least two measured-value signals are generated for the secondary current, of which a first measured-value signal corresponds to the secondary current when the first semiconductor switch is closed, and a second measured-value signal corresponds to the secondary current when the first semiconductor switch is open, and the output current is determined by generating the difference between the first and the second measured-value signal.

2. The method of claim 1, wherein the first and the second measured signal are generated by sampling the secondary current.

3. The method of claim 1, wherein the sampling for the first measured-value signal takes place centered in a time interval while the first semiconductor switch is closed, and/or the sampling for the second measured-value signal takes place centered in a time interval while the first semiconductor switch is open.

4. The method of one of claim 1, wherein in the output circuit an alternating-current measurement is performed, in a first operating state, in which the first semiconductor switch is closed, measured values for the output current determined with the aid of the secondary current and for the alternating current in the output circuit are added together, and the result of the addition is inverted and saved, in the first operating state the output current determined with the aid of the secondary current provides the measurement result, in a second operating state, in which the second semiconductor switch is closed, the saved value is added to the alternating-current measured value measured in the second operating state in the output circuit, and this total forms the measurement result in the second operating state.

5. The method of claim 1, wherein in the output circuit an alternating-current measurement is performed, in a first operating state, in which the first semiconductor switch is closed, measured values for the output current determined with the aid of the secondary current and for the alternating current in the output circuit are added together and saved, in the first operating state the output current determined with the aid of the secondary current provides the measurement result, in a second operating state, in which the second semiconductor switch is closed, the saved value is subtracted from the alternating-current measured value measured in the second operating state in the output circuit, and this total forms the measurement result in the second operating state.

6. A measuring device for measuring the output current of a clocked half-bridge circuit having at least one half-bridge with two half-bridge sections connected in series, whose connection node is connected to an output connection, and a first semiconductor switch is disposed in a first half bridge section, and a second semiconductor switch is disposed in a second-half-bridge section, which switches are controllable by means of a control device in push-pull operation, and having an alternating-current converter whose output is connected to a measured-signal output of the measured-value signal conditioning device, which has a measurement output for an output current measured signal, wherein the input of the alternating-current converter is connected in series in the first half bridge section to the first semiconductor switch, the measured-value signal conditioning device has means for generating at the least two measured-value signals, of which a first measured-value signal corresponds to the output current of the alternating-current converter when the first semiconductor switch is closed, and a second measured-value signal corresponds to the output current of the alternating-current converter when the first semiconductor switch is open, and the connections carrying the measured-value signals are connected to the measurement output by means of a subtraction element.

7. The measuring device of claim 6, wherein in order to generate the measured-value signals said device has at least one sample-and-hold element whose input connection is connected to the output of the alternating-current converter, and an output connection of the sample-and-hold element preferably is connected to the output current measurement output by means of an analog-digital converter.

8. The measuring device of claim 7, wherein the sample-and-hold element is connected by means of a control connection to the control device for the semiconductor switches in such a way that the sampling for the first measured-value signal occurs centered in a time interval while the first semiconductor switch is closed, and/or the sampling for the second measured-value signal occurs centered in a time interval while the first semiconductor switch is open.

9. The measuring device of claim 6, wherein the alternating-current converter has a primary inductance ($L_H$) and an ohmic secondary resistance ($R_S$); an active compensation circuit, which at least partially compensates for the voltage drop caused at the primary inductance ($L_H$) by a current flow in the secondary resistance ($R_S$) by applying a voltage at the output of the alternating-current converter, is located between the output of the alternating-current converter and the measurement output.

10. The measuring device of claim 9, wherein the compensation circuit is an INIC.

11. The measuring device of claim 6, wherein the output of the alternating-current converter is connected to a first input of a subtraction element, the output of the subtraction element is connected to the measurement output and to an input of an additional sample-and-hold element, whose output is connected to a second input of the subtraction element, and a sampling input of the additional sample-and-hold element is connected to the control device by means of a control connection in such a way that the measurement output is at a specified electrical potential when the first semiconductor switch is closed or open.

12. The measuring device of claim 6 includes a second alternating-current converter, wherein the output of the first alternating-current converter and the output of the second alternating-current converter are connected to the inputs of a first addition element and its output to a buffer, the buffer has a control connection to the control device for closing the connection between the output of the first addition element and the buffer when the semiconductor switch is closed, after the buffer a second addition element is connected to the buffer, and said second addition element's one input is connected to the buffer and its other input is connected to the output of the second alternating-current converter, and the output of the second addition element forms the output current measuring output.

13. The measuring device of claim 12, wherein the second alternating-current converter has a second primary inductance and a second ohmic secondary resistance, and a second active compensation circuit, which at least partially compensates for the voltage drop caused at the second primary inductance by a current flow in the second secondary resistance by applying a voltage at the output of the second alternating-current converter, is located between the output of the second alternating-current converter and the inputs of the first addition element.

14. The measuring device of one claim 6, wherein the output connection is connected to the winding of an electric motor, in particular a stepper motor.

* * * * *

UNITED STATES PATENT AND TRADEMARK OFFICE
CERTIFICATE OF CORRECTION

| | | |
|---|---|---|
| PATENT NO. | : 7,521,920 B2 | Page 1 of 1 |
| APPLICATION NO. | : 11/843472 | |
| DATED | : April 21, 2009 | |
| INVENTOR(S) | : Thomas Leibl | |

It is certified that error appears in the above-identified patent and that said Letters Patent is hereby corrected as shown below:

Column 8, Line 62, Claim 14, "of one claim 6" should read -- of claim 6 --

Signed and Sealed this

Twenty-eighth Day of July, 2009

JOHN DOLL
*Acting Director of the United States Patent and Trademark Office*